(12) United States Patent
Hagura et al.

(10) Patent No.: US 6,717,878 B2
(45) Date of Patent: Apr. 6, 2004

(54) SEMICONDUCTOR DEVICE

(75) Inventors: Tsukasa Hagura, Tokyo (JP); Masaki Tsukude, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/263,088

(22) Filed: Oct. 3, 2002

(65) Prior Publication Data

US 2003/0185031 A1 Oct. 2, 2003

(30) Foreign Application Priority Data

Mar. 28, 2002 (JP) .................................. P2002-091616

(51) Int. Cl.[7] .................................................. G11C 7/04
(52) U.S. Cl. ...................................... 365/211; 365/222
(58) Field of Search ................................. 365/211, 222

(56) References Cited

U.S. PATENT DOCUMENTS 6,230,560 B1 * 5/2001 Suzuki .................... 73/204.25

* cited by examiner

Primary Examiner—Michael Tran
(74) Attorney, Agent, or Firm—McDermott, Will & Emery

(57) ABSTRACT

A first reference current having a first temperature characteristic is generated by a first reference current generating circuit (1) while a second reference current having a second temperature characteristic is generated by a second reference current generating circuit (2). A temperature characteristic multiplying circuit (3) amplifies the first reference current by using a current difference between the first and second reference currents to generate a reference current having a third temperature characteristic higher than the first temperature characteristic, so that a ring oscillator (X) determines a refresh period on the basis of the reference current.

8 Claims, 6 Drawing Sheets

SEMICONDUCTOR DEVICE

BACKGROUND OF THE INVENTION

1. Field of the Invention

The present invention relates to a semiconductor memory device which requires a refresh operation as a DRAM.

2. Description of the Related Art

In a semiconductor memory device, for example, a DRAM, a refresh (this is called as self-refresh) operation must be periodically carried out in order to hold data. FIG. 7 shows a self-refresh periodic control circuit for carrying out the above self-refresh operation. A reference numeral 1 denotes a reference current generating circuit, which is constituted by P-type MOS (hereinafter, referred to as PMOS) transistors P1 and P2, N-type MOS (hereinafter, referred to as NMOS) transistors N1 and N2, and a resistor R1. An output of the reference current generating circuit 1 is inputted to a ring oscillator circuit X.

FIG. 8 shows a circuit configuration of the ring oscillator X. The ring oscillator X are provided with odd transistor couples, and an output of the final stage of the transistor couples is fed back to the initial state, and thereby the ring oscillator X is oscillated at a certain period. The period becomes short when a reference current to the ring oscillator X becomes large. The ring oscillator X carries out a self-refresh operation based on the oscillation period. Therefore, a temperature characteristic of the self-refresh period coincides with a temperature characteristic of current outputted by the reference current generating circuit 1.

Usually, the temperature characteristic of the reference current generating circuit 1 having the above circuit configuration is approximately 1, that is, the reference current generating circuit 1 has almost no temperature characteristic. Therefore, the ring oscillator X has almost no temperature characteristic. As a result, a self-refresh operation is carried out at a predetermined period regardless of an ambient temperature.

By the way, in the DRAM, a data holding capability becomes worse in a high temperature, so that the self-refresh period is set such that it can be optimized in the high temperature. However, in a normal temperature, a refresh holding capability is higher than the case of the high temperature; nevertheless, the self-refresh operation is carried out at the period set in the high temperature. As a result, the self-refresh operation is carried out at the period shorter than DRAM refresh capability; for this reason, in the normal temperature, a problem arises such that the refresh operation has been carried out over the necessity.

SUMMARY OF THE INVENTION

The present invention has been made in order to solve the above problem that the refresh operation is wastefully carried out in a normal temperature, and object of the present invention is to provide a semiconductor device which can make a self-refresh period longer in a normal temperature.

A semiconductor device such as a DRAM is provided with an internal circuit for determining a refresh period. The internal circuit generates a predetermined period on the basis of a reference current supplied thereto. If the reference current is set so as to have a positive temperature characteristic, it is convenient since the refresh period becomes long in a low temperature. However, in this case, a problem arises such that it is impossible to largely vary the temperature characteristic by a small temperature change.

Therefore, a semiconductor device according to a first aspect of the present invention is provided with:
- a first reference current generating circuit (1) which generates a first reference current having a first temperature characteristic;
- a second reference current generating circuit (2) which generates a second reference current having a second temperature characteristic; and
- a temperature characteristic multiplying circuit (3) which multiplies the temperature characteristic of one reference current by using a current difference between the first and second reference currents. Furthermore, an output current of the temperature characteristic circuit is supplied to the internal circuit.

The temperature characteristic multiplying circuit (3) includes:
- a first P-type MOS transistor (P5) which has a gate for receiving the first reference current and which has a source connected to a first power supply;
- a first N-type MOS transistor (N5) which has a gate for receiving the second reference current, which has a source connected to a second power supply and which has a drain connected to a drain of the first P-type MOS transistor; and
- a second P-type MOS transistor (P6) which has a source connected to the first power supply and which has a gate and a drain connected to a junction point (drain) between the first P-type MOS transistor and the second N-type MOS transistor. Therefore, a reference current having a multiplied temperature characteristic can be obtained from the junction point.

A semiconductor device according to a second aspect of the present invention is provided with a synthesizing section (5) which synthesizes the first or second reference current with an output current of the temperature characteristic multiplying circuit (3), in order to prevent the refresh period from becoming too long. By doing so, in the lower temperature, the synthesizing section outputs the first or second reference current.

A semiconductor device according to a third aspect of the present invention is provided with a tuning section (6) which controls at least one of the first and second reference currents to a desired value, in order to correct a dispersion of process when manufacturing the device, and an output of the tuning section is supplied to the temperature characteristic multiplying circuit (3).

According to a fourth aspect of the present invention, in order to be capable of adjusting the output of the reference current even after completion of the semiconductor device, a fuse blow is connected to each of a plurality of transistor having different sizes, they are connected in parallel to each other, and the fuse blow is selectively disconnected in the tuning section (6) according to the third aspect.

According to a fifth aspect of the present invention, in order to obtain a further multiplied temperature characteristic, the temperature characteristic multiplying circuit has a two-stage connecting configuration.

In a case where the internal circuit is an oscillator which supplies a signal into the semiconductor device, the oscillator is used for a refresh operation of a dynamic memory included in the semiconductor device.

DETAILED DESCRIPTION OF THE PREFERRED EMBODIMENTS

First Embodiment

Figure 1:
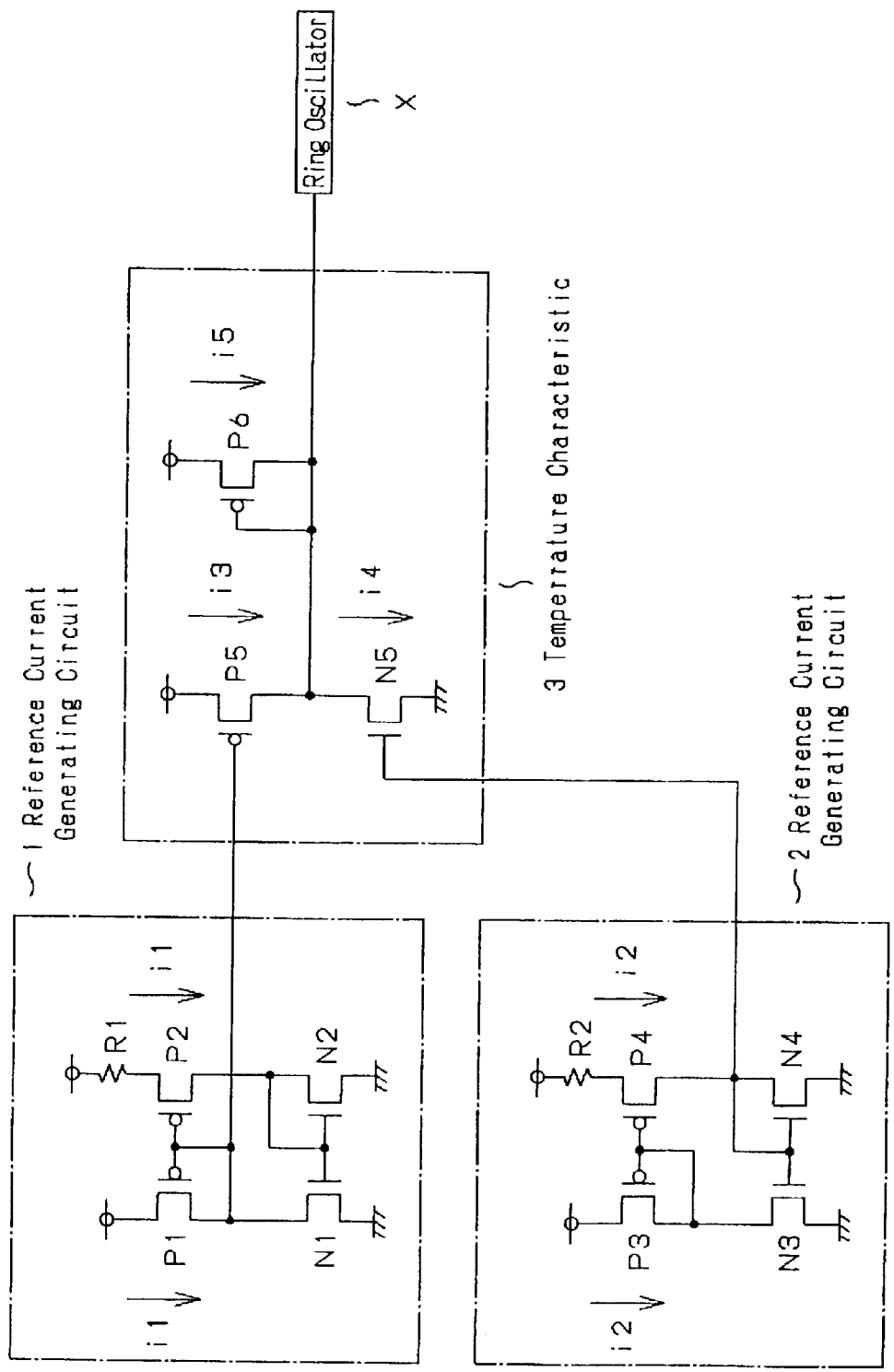
FIG. 1 is a diagram showing a reference current generating circuit of a semiconductor device according to a first embodiment of the present invention.

The preferred embodiments of the present invention will be described below with reference to the accompanying drawings. In FIG. 1, a reference current generating circuit 1 is constituted by PMOS transistors P1, P2, NMOS transistors N1, N2, and a resistor R1. Further, a reference current generating circuit 2 is constituted by PMOS transistors P3, P4, NMOS transistors N3, N4, and a resistor R2. The above reference current generating circuits both have a well-known circuit configuration.

A reference numeral 3 denotes a temperature characteristic multiplying circuit for multiplying each temperature characteristic coefficient of the above two reference current generating circuits 1 and 2. The temperature characteristic multiplying circuit 3 is constituted by PMOS transistors P5, P6, and an NMOS transistor N5. Since an output of the temperature characteristic multiplying circuit 3 is inputted to a ring oscillator X, a temperature characteristic of self-refresh period coincides with a temperature characteristic of voltage outputted by the temperature characteristic multiplying circuit 3.

Next, the following is a description of an operation of the temperature characteristic multiplying circuit 3. An output of the reference current generating circuit 1 is inputted to a gate of the transistor P5 of the temperature characteristic multiplying circuit 3. Therefore, a temperature characteristic of current i3 carried by the transistor P5 is equal to a temperature characteristic of voltage outputted by the reference current generating circuit 1. Further, an output of the reference current generating circuit 2 is inputted to a gate of the transistor N5 of the temperature characteristic multiplying circuit 3. Therefore, a temperature characteristic of current i4 carried by the transistor N5 is equal to a temperature characteristic of voltage outputted by the reference current generating circuit 2.

In this case, the temperature characteristic of the reference current generating circuit 1 is set as "b", and the temperature characteristic of the reference current generating circuit 1 is set as "a". Further, the current i5 in high temperature is set as i5(HT)=i, and a current ratio of i5 to i3 in high temperature is set as i5(HT):i3(HT)=1:n, and the current i3 and i4 in normal temperature are set as i3(RT) and i4(RT), respectively. When setting as described above, the following equations are obtained.

$i3(RT) = ni/b$ $i4(RT) = (n+1)i/a$

Therefore, the temperature characteristic of i5 in normal temperature, that is, i5(RT) is obtained from the following equation.

$$i5(RT) = i4(RT) - i3(RT) = (n+1)i/a - ni/b$$

$$= \{b(n+1) - an\}i/(ab)$$

Thus, the temperature characteristic of the current i5 is obtained from dividing the current i5(HT) in high temperature by the current i5(RT) in normal temperature, that is, the following equation (1).

$$ab/\{b(n+1)-an\} \qquad (1)$$

Namely, the current i5 is the output from the temperature characteristic multiplying circuit 3, and the ring oscillator X is controlled by using the current i5. Therefore, the temperature characteristic of self-refresh period becomes equal to the temperature characteristic of the current i5.

To give an example, when substituting a=1.1, b=0.9, n=3 for the above equation (1), the obtained temperature characteristic of the current i5 is "3.3". As described above, even in the case where the reference current generating circuit having a small temperature characteristic of 1.1 is used, a large temperature characteristic of 3.3 is obtained. Therefore, the self-refresh period in normal temperature is 3.3 times as much as the high temperature; as a result, the optimum large self-refresh period can be obtained.

In this case, in order to obtain two kinds of temperature characteristics as the above reference current generating circuits 1 and 2, another resistor material is used. To give an example, a well material is used as the resistor R1 of the reference current generating circuit 1; on the other hand, a polysilicon material is used as the resistor R2 of the reference current generating circuit 2.

Figure 6:
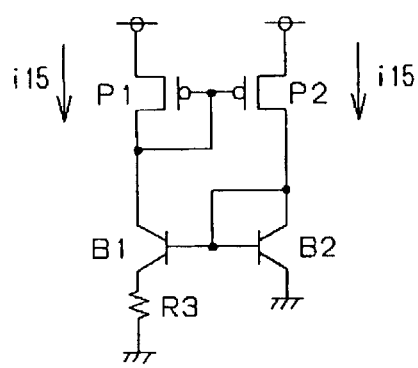
FIG. 6 is a diagram showing another embodiment of a reference current generating circuit.
Figure 7:
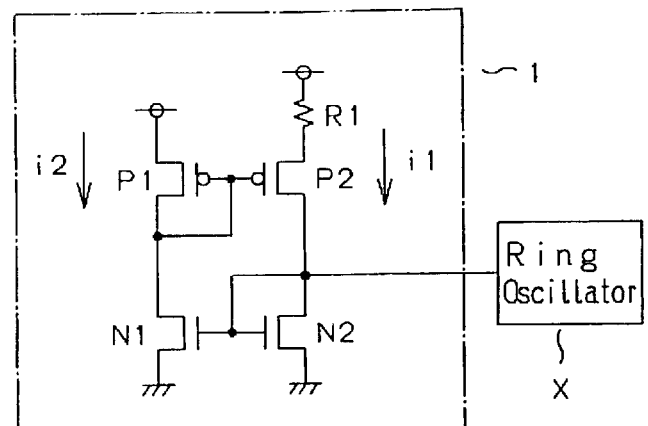
FIG. 7 is a diagram showing a conventional reference current generating circuit.
Figure 8:
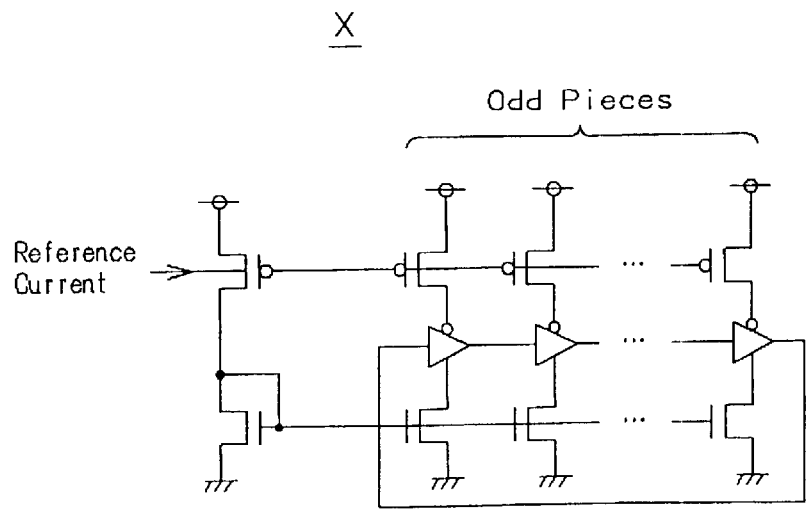
FIG. 8 is a diagram showing a ring oscillator.

Moreover, FIG. 6 shows another embodiment of the above reference current generating circuits 1 and 2. In this case, ordinary bipolar transistors B1 and B2 are used in place of the NMOS transistors N1 and N2 (N3 and N4 in the reference current generating circuit 2).

Second Embodiment

Figure 2:
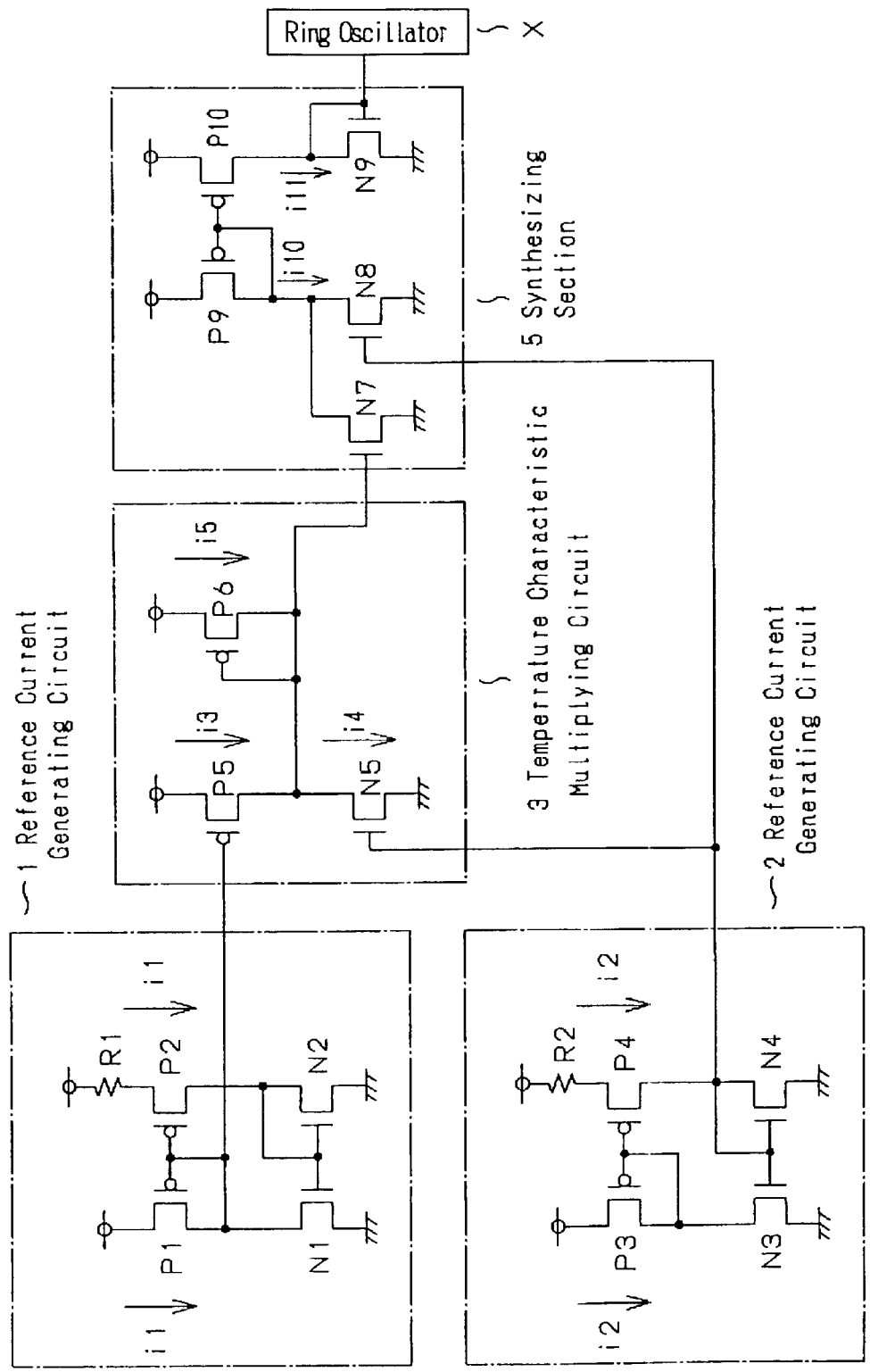
FIG. 2 is a diagram showing a reference current generating circuit of a semiconductor device according to a second embodiment of the present invention.

FIG. 2 shows a second embodiment of the present invention. In this second embodiment, a synthesizing section 5 is provided as additional function in addition to the circuit configuration of FIG. 1. The synthesizing section 5 is a circuit for synthesizing a generated voltage of the temperature characteristic multiplying circuit 3 with a generated voltage of the reference current generating circuit 2. Further, the synthesizing section 5 is constituted by PMOS transistors P9, P10, NMOS transistors N7, N8 and N9. A generated voltage of the synthesizing section 5 is inputted to the ring oscillator X.

According to the configuration shown in FIG. 1, the optimum self-refresh period is obtained in the normal temperature. However, when the temperature becomes lower than the normal temperature, the self-refresh period becomes further longer, so that the data can not be held. The synthesizing section 5 has a function for preventing the period of the ring oscillator from becoming long in a low temperature. More specifically, the synthesizing section 5 synthesizes a generated current of the temperature characteristic multiplying circuit 3 with a current having a small temperature characteristic from the reference current generating circuit 2. By doing so, even if the generated current of the temperature characteristic multiplying circuit 3 becomes low, a lowest limit period can be secured by the small temperature characteristic from the reference current generating circuit 2.

Third Embodiment

Figure 3:
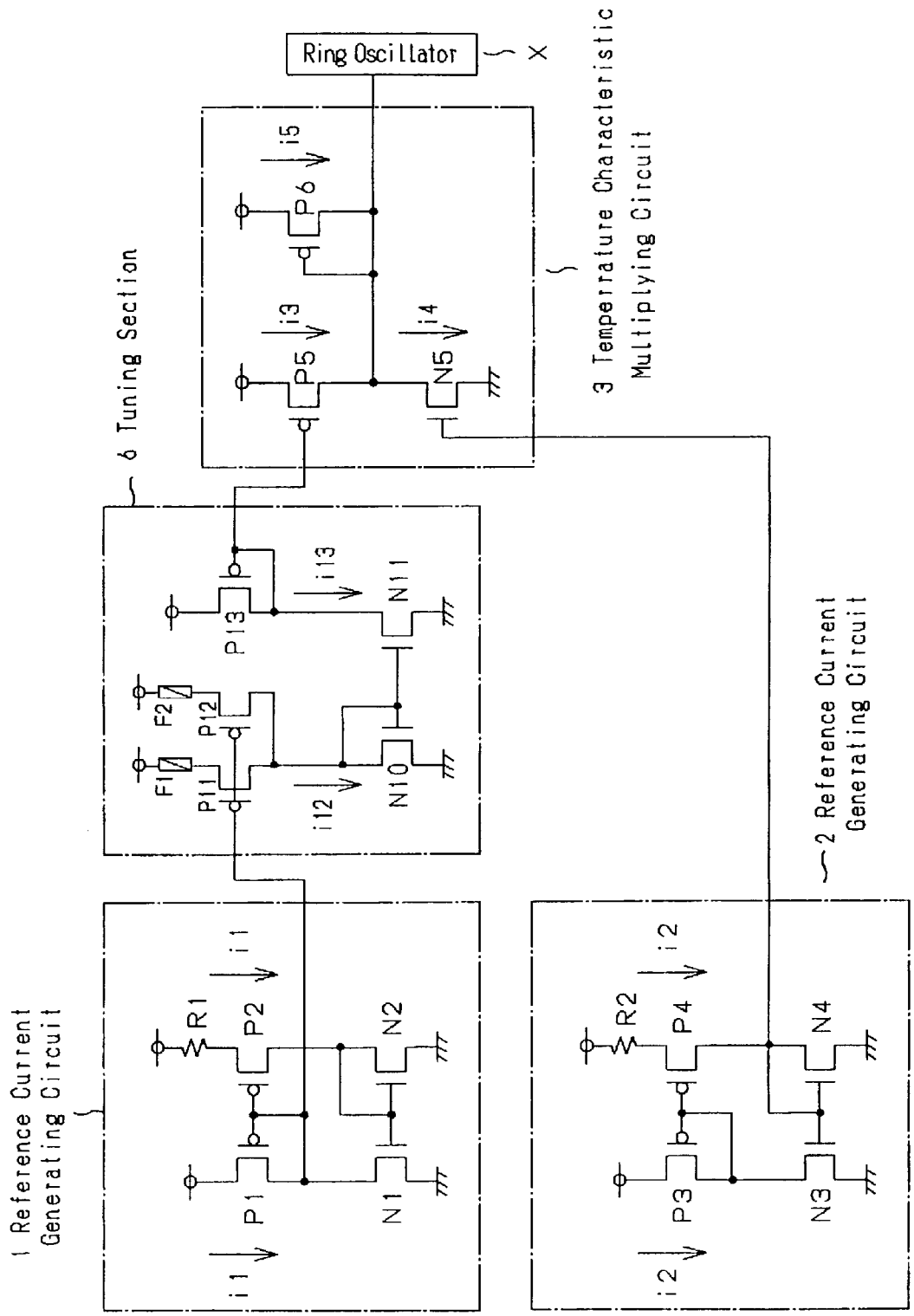
FIG. 3 is a diagram showing a reference current generating circuit of a semiconductor device according to a third embodiment of the present invention.

FIG. 3 shows a third embodiment of the present invention. In this third embodiment, a tuning section 6 is provided as additional function in addition to the circuit configuration of FIG. 1. In FIG. 3, the tuning section 6 is constituted by PMOS transistors P11, P12, P13, NMOS transistors N10, N11, and fuses F1, F2.

As described in FIG. 1, in order to obtain a desired temperature characteristic in the configuration of the present invention, the current i3 and i4 in high temperature must have a desired ratio. However, since there is a variation in process, usually, a current ratio of i3 to i4 is not set to a design value. In order to set the current ratio to a desired value, the tuning section 6 is provided.

In this third embodiment, fuse blow of the fuses F1 and F2 of the tuning section 6 is combined so as to convert the generated current of the reference current generating circuit 1 into an arbitrary current, and thereby the current i3 and i4 can be set to a desired ratio. For example, when a size ratio of the PMOS transistors P11 to P12 is set as P11:P12=1:2 and a current i12 when blowing through the fuse F2 is set as i, the current i12 is 2i when it blowing through the fuse F1, and is 3i when it does not blowing through both fuses F1 and F2.

Fourth Embodiment

Figure 4:
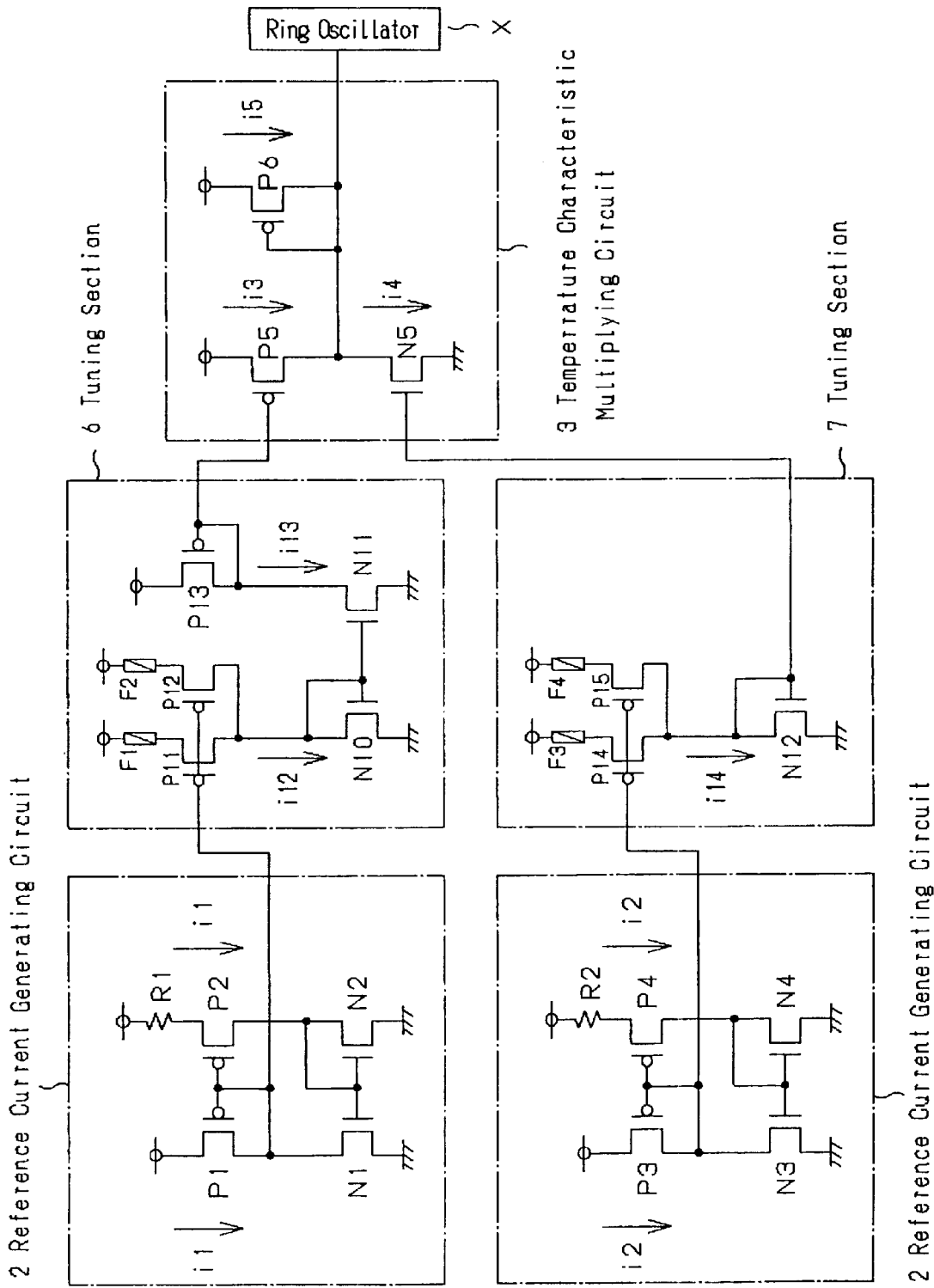
FIG. 4 is a diagram showing a reference current generating circuit of a semiconductor device according to a fourth embodiment of the present invention.

FIG. 4 shows a fourth embodiment of the present invention. In this fourth embodiment, two kinds of tuning sections 6 and 7 are individually provided at the after stage of the reference current generating circuits 1 and 2 so the generated currents of the reference current generating circuits 1 and 2 can be independently converted into an arbitrary current. According to the configuration, it is possible to further improve a degree of freedom of tuning as compared with the configuration of FIG. 3.

As described above, in the semiconductor device of the present invention, the self-refresh period having a large temperature characteristic can be obtained by the reference current generating circuit having a small temperature characteristic. Further, it is possible to prevent the period from becoming too long in low temperature. Further, it is possible to stably operate the semiconductor device with respect to a variation of wafer process.

Fifth Embodiment

Figure 5:
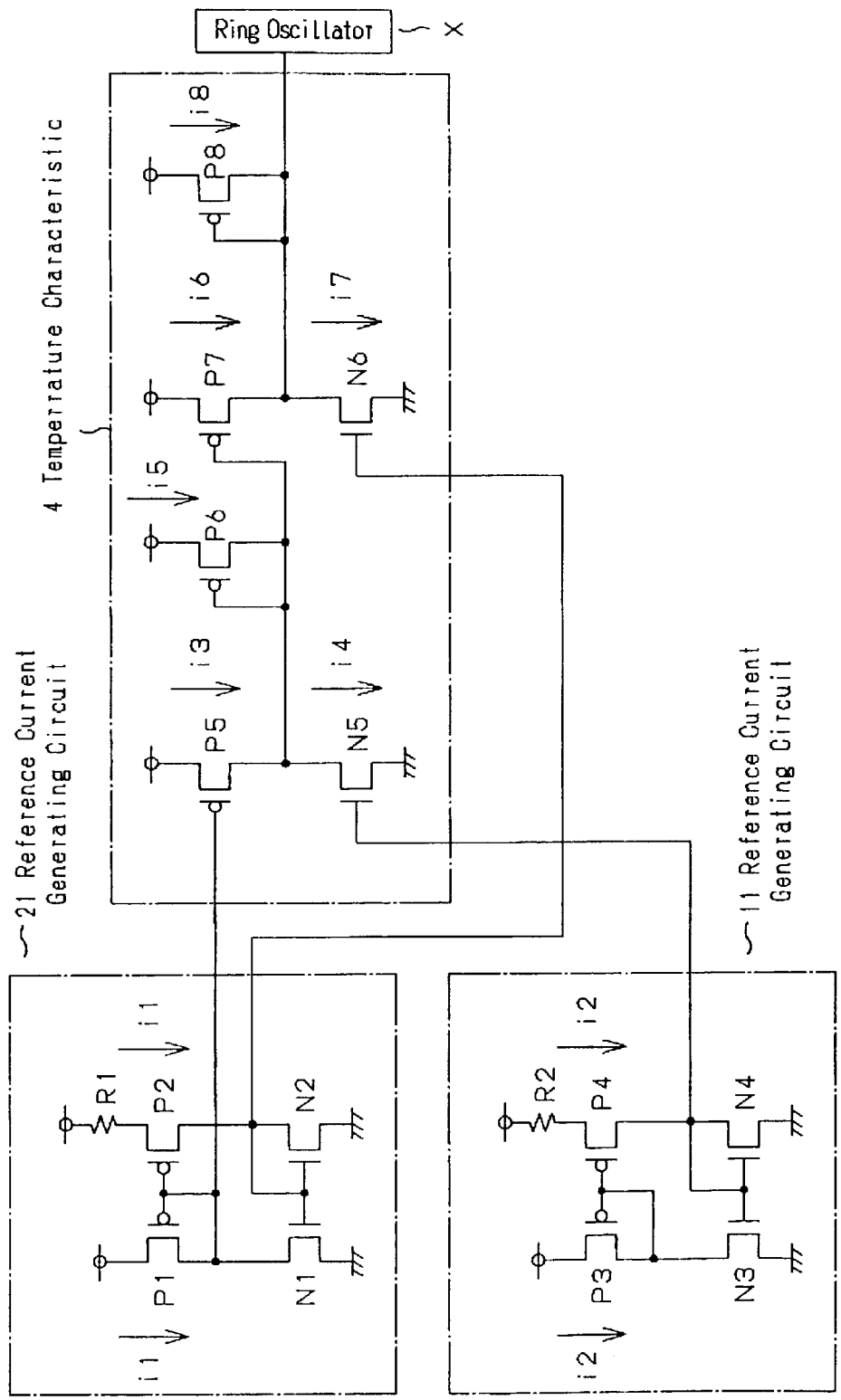
FIG. 5 is a diagram showing a reference current generating circuit of a semiconductor device according to a fifth embodiment of the present invention.

FIG. 5 shows a fifth embodiment of the present invention. This fifth embodiment will be described below with reference to FIG. 5. In FIG. 5, a reference current generating circuit 11 has the same circuit configuration as the reference current generating circuit 1 of FIG. 1. However, in this case, the reference current generating circuit 11 outputs two generated voltages from each drain terminal of NMOS transistors N2 and N4. Further, a reference current generating circuit 21 has the same circuit configuration as the reference current generating circuit 2 of FIG. 1. However, in this case, the reference current generating circuit 11 outputs two generated voltages from a drain terminal of the NMOS transistor N3.

A reference numeral 4 denotes a temperature characteristic multiplying circuit for multiplying each temperature characteristic coefficient of the reference current generating circuits 11 and 21. The temperature characteristic multiplying circuit 4 is constructed in a manner that the temperature characteristic multiplying circuit 1 of FIG. 1 is connected in the two-stage form. That is, a circuit comprising PMOS transistors P7, P8 and NMOS transistor N6 is connected to the after stage of a circuit comprising PMOS transistors P5, P6 and NMOS transistor N5, a so-called two-stage configuration is provided. The above two circuits have the same circuit configuration. According to the above configuration, the temperature characteristic of self-refresh period is equal to an output of the temperature characteristic multiplying circuit 4.

Next, the following is a description of an operation of the temperature characteristic multiplying circuit 4. An output of the reference current generating circuit 11 is inputted to a gate of the transistor N5 of the temperature characteristic multiplying circuit 4. Therefore, a temperature characteristic of current i4 carried by the transistor N5 is equal to a temperature characteristic of voltage outputted by the reference current generating circuit 11. Further, an output of the reference current generating circuit 21 is inputted to a gate of the transistors P5 and N6 of the temperature characteristic multiplying circuit 4. Therefore, a temperature characteristic of current i3 and i7 carried by the transistors P5 and N6 is equal to a temperature characteristic of voltage outputted by the reference current generating circuit 21.

In this case, the temperature characteristic of the reference current generating circuit 11 is set as "b", and the temperature characteristic of the reference current generating circuit 21 is set as "a". Further, when the current i5 in high temperature is set as i5(HT)=i, and a current ratio of i5 to i3 in high temperature is set as i5(HT):i3(HT)=1:n, the current i3 and i4 in normal temperature are as the following equations.

$$i3(RT) = ni/b$$

$$i4(RT) = (n+1)i/a$$

Therefore, the temperature characteristic of i5 in normal temperature, that is, i5(RT) is obtained from the following equation.

$$i5(RT) = i4(RT) - i3(RT) = (n+1)i/b - ni/n$$

$$= \{a(n+1) - bn\}i/(ab)$$

Thus, the temperature characteristic of the current i5 is obtained from dividing the current i5 in high temperature by the current i5 in normal temperature, that is, the following equation (2).

$$ab/\{a(n+1)-bn\} \qquad (2)$$

Moreover, the current i8 in high temperature is set as i8(HT)=i, and a current ratio of i8 to i6 in high temperature is set as i8(HT):i6(HT)=1:m. The temperature characteristic of the current i6 is equal to the temperature characteristic of the current i5 obtained above, that is, the above equation of $ab/\{a(n+1)-bn\}$. Therefore, the current i6 and i7 in normal temperature are obtained from the following equations, respectively.

$$i6(RT) = \{a(n+1)-bn\}mi/(ab)$$

$$i7(RT) = (m+1)i/a$$

Thus, the current i8 in normal temperature is obtained from the following equation.

$$i8(RT) = i7(RT) - i6(RT)$$

$$= (m+1)i/a - \{a(n+1) - bn\}\mathrm{mi}/(ab)$$

$$= \{b(1+m+mn) - ma(n+1)\}i/(ab)$$

The temperature characteristic of the current i8 is obtained by dividing the current i8 in high temperature by the current i8 in normal temperature; therefore, it is obtained from the following equation.

$$ab/\{b(1+m+mn)-ma(n+1)\}$$

The temperature characteristic multiplying circuit 4 has the two-stage configuration; therefore, it is possible to further multiply the temperature characteristic. The synthesizing section 5 of FIG. 2, the tuning section 6 of FIG. 3 and the tuning section 7 of FIG. 4 may be selectively added to the circuit configuration of FIG. 5. By doing so, it is possible to obtain a desired temperature coefficient at a higher degree of freedom.

According to the first and second aspects of the present invention, based on a first reference current having a first temperature characteristic generated by the first reference current generating circuit, and a second reference current having a second temperature characteristic generated by the second reference current generating circuit, the temperature characteristic multiplying circuit multiplies the temperature characteristic of one reference current. Further, temperature characteristic multiplying circuit supplies a reference current having a large temperature characteristic to an internal circuit. Therefore, the semiconductor device of the present invention can perform a high-speed operation in a high temperature.

According to the third aspect of the present invention, the above temperature characteristic multiplying circuit is constituted by a first PMOS transistor, a first NMOS transistor, and a second PMOS transistor. More specifically, the first PMOS transistor has a gate for inputting the first reference current and a source connected to a first power supply. The first NMOS transistor has a gate for inputting the second reference current, a source connected to a second power supply and a drain connected to a drain of the first PMOS transistor. The second PMOS transistor has a source connected to the first power supply, a gate and a drain connected to the drain of the first PMOS transistor and the drain of the first NMOS transistor. Therefore, it is possible to multiply the temperature coefficient with a simple circuit configuration.

According to the fourth aspect of the present invention, the semiconductor device includes a synthesizing section for synthesizing an output current of the temperature characteristic multiplying circuit with the first or second reference current, and an output of the synthesizing section is supplied to an internal circuit. Further, in the low temperature, reference is made with respect to the first or second reference current. Therefore, it is possible to prevent the operation of the internal circuit from becoming too late in the low temperature. In addition, in the case where the internal circuit is a ring oscillator, it is possible to prevent a period from becoming too long.

According to the fifth aspect of the present invention, the semiconductor device includes a tuning section for controlling at least one of the first and second reference currents to a desired value. Therefore, it is possible to correct a variation of process when manufacturing the device, and thus, to obtain a desired output reference current.

According to the sixth aspect of the present invention, the tuning section has a configuration in which a circuit having a fuse blow connected to a plurality of transistors having different size is connected in parallel, and selectively breaks the fuse blow. Therefore, it is possible to readily adjust the output of the reference current even after the semiconductor device is completed.

According to the seventh aspect of the present invention, the temperature characteristic multiplying circuit has a two-stage connection configuration; therefore, it is possible to connect a temperature characteristic multiplying circuit having a two-stage or more configuration.

According to the eighth aspect of the present invention, the output of the temperature characteristic multiplying circuit is supplied to the oscillator (ring oscillator); therefore, it is possible to improve an oscillation frequency in the high temperature, and thus, to operate the semiconductor device at a high speed.

According to the ninth aspect of the present invention, since the output of the temperature characteristic multiplying circuit is supplied to the ring oscillator, the self-refresh period in the normal temperature can be set longer than the period in the high temperature. Therefore, it is possible to obtain the optimum refresh period in the normal temperature.

What is claimed is:

1. A semiconductor device comprising:
   a first reference current generating circuit which generates a first reference current having a first temperature characteristic;
   a second reference current generating circuit which generates a second reference current having a second temperature characteristic;
   a temperature characteristic multiplying circuit which multiplies the temperature characteristic of one reference current by using a current difference between the first and second reference currents; and
   an internal circuit of which operation is controlled by an output of the temperature characteristic multiplying circuit.

2. A semiconductor device according to claim 1, wherein the temperature characteristic multiplying circuit includes:
   a first P-type MOS transistor which has a gate for receiving the first reference current and which has a source connected to a first power supply;
   a first N-type MOS transistor which has a gate for receiving the second reference current, which has a source connected to a second power supply and which has a drain connected to a drain of the first P-type MOS transistor; and
   a second P-type MOS transistor which has a source connected to the first power supply and which has a gate and a drain connected to the drain of the first P-type MOS transistor and the drain of the first N-type MOS transistor.

3. A semiconductor device according to claim 1, further comprising a synthesizing section which synthesizes the first or second reference current with an output current of the temperature characteristic multiplying circuit, wherein an output of the synthesizing section is supplied to the internal circuit.

4. A semiconductor device according to claim 1, further comprising a tuning section which controls at least one of the first and second reference currents to a desired value, wherein an output of the tuning section is supplied to the temperature characteristic multiplying circuit.

5. A semiconductor device according to claim 4, wherein a fuse blow is connected to each of a plurality of transistor having different sizes, they are connected in parallel to each other, and the fuse blow is selectively disconnected in the tuning section.

6. A semiconductor device according to claim 1, wherein the temperature characteristic multiplying circuit has a two-stage connecting configuration.

7. A semiconductor device according to claim 1, wherein the internal circuit is an oscillator which supplies a signal into the semiconductor device.

8. A semiconductor device according to claim 7, wherein the oscillator is used for a refresh operation of a dynamic memory in the semiconductor device.

* * * * *